US012532405B2

(12) United States Patent
Luo et al.

(10) Patent No.: US 12,532,405 B2
(45) Date of Patent: Jan. 20, 2026

(54) FILTER CIRCUIT

(71) Applicant: PONTOSENSE INC., Waterloo (CA)

(72) Inventors: Yunlong Luo, Guangdong (CN); Alex Qi, Waterloo (CA); Ge Shi, Guangdong (CN); Yihong Qi, Guangdong (CN); Ruini Xue, Guangdong (CN); Ronghao Jin, Guangdong (CN)

(73) Assignee: PONTOSENSE INC., Waterloo (CA)

( * ) Notice: Subject to any disclaimer, the term of this patent is extended or adjusted under 35 U.S.C. 154(b) by 378 days.

(21) Appl. No.: 18/251,388

(22) PCT Filed: Nov. 3, 2021

(86) PCT No.: PCT/CN2021/128300
§ 371 (c)(1),
(2) Date: May 1, 2023

(87) PCT Pub. No.: WO2022/095867
PCT Pub. Date: May 12, 2022

(65) Prior Publication Data
US 2023/0422392 A1 Dec. 28, 2023

(30) Foreign Application Priority Data
Nov. 4, 2020 (CN) .......................... 202011216754.2

(51) Int. Cl.
*H05K 1/02* (2006.01)
*H03H 7/01* (2006.01)

(52) U.S. Cl.
CPC ......... *H05K 1/0233* (2013.01); *H03H 7/0138* (2013.01); *H05K 1/0216* (2013.01);
(Continued)

(58) Field of Classification Search
CPC ............... H05K 1/0233; H05K 1/0218; H05K 2201/10015; H05K 2201/1006;
(Continued)

(56) References Cited

U.S. PATENT DOCUMENTS

2008/0309431 A1  12/2008  Hui et al.
2009/0058558 A1*  3/2009  Okano ................. H05K 1/0231
361/748

(Continued)

FOREIGN PATENT DOCUMENTS

CN      1949953 A    4/2007
CN    101409137 A    4/2009
(Continued)

OTHER PUBLICATIONS

International Search Report; International Patent Application No. PCT/CN2021/128300; Dec. 22, 2021; China National Intellectual Property Administration (ISA/CN), Beijing, China.

*Primary Examiner* — Steven T Sawyer
(74) *Attorney, Agent, or Firm* — Central California IP Group, P.C.; Andrew D. Fortney

(57) ABSTRACT

Disclosed in the present invention is a filter circuit. A first PCB layer consists of a power line, a power interface, a second filter capacitor, and a first filter capacitor; the power line comprises a power supply network and a GND network; the second PCB layer is provided with a conductor plane; the power interface is connected to the GND network and is further connected to the conductor plane; the GND network, the second filter capacitor, and the conductor plane are sequentially connected; the power supply network, the first filter capacitor, and the conductor plane are sequentially connected. The circuit design of the circuit structure and the overall layout design idea in the present invention have a
(Continued)

good suppression effect on common-mode noise, differential mode noise, radiation noise and conduction noise.

11 Claims, 4 Drawing Sheets

(52) U.S. Cl.
CPC ......... *H05K 1/0218* (2013.01); *H05K 1/0262* (2013.01); *H05K 2201/093* (2013.01); *H05K 2201/10015* (2013.01); *H05K 2201/1006* (2013.01)

(58) Field of Classification Search
CPC ............... H05K 1/0262; H05K 1/115; H05K 2201/093; H05K 1/0231; H05K 1/0298; H05K 1/0216; H05K 1/162; H05K 1/165; H02M 1/126; H02M 1/123; H02M 3/003; H02M 7/003; H02M 1/44; H03H 7/01; H03H 7/0115; H03H 7/0138; H03H 7/0153

See application file for complete search history.

(56) References Cited

U.S. PATENT DOCUMENTS

| | | | | |
|---|---|---|---|---|
| 2009/0206951 | A1* | 8/2009 | Nakamura | H05K 1/165 333/181 |
| 2010/0039784 | A1* | 2/2010 | Hayashi | H05K 1/0234 361/783 |
| 2014/0049929 | A1* | 2/2014 | Yamaguchi | H05K 1/0216 361/782 |
| 2016/0086723 | A1* | 3/2016 | Su | H05K 1/0373 336/200 |
| 2017/0086289 | A1* | 3/2017 | Takahashi | H02M 1/14 |

FOREIGN PATENT DOCUMENTS

| | | |
|---|---|---|
| CN | 103022730 A | 4/2013 |
| CN | 211791262 U | 10/2020 |
| CN | 213367740 U | 6/2021 |
| WO | 2017032107 A1 | 3/2017 |

* cited by examiner

FILTER CIRCUIT

TECHNICAL FIELD

The present invention relates to filter techniques, and in particular to a filter circuit.

BACKGROUND ART

Conduction noise and radiation noise at the power interface of electronic products with external power supply have very strict test requirements. If the noise exceeds the standard, it will affect the normal operation of other electronic products and also affect their own circuit performance and stability.

Common filter circuits include passive filter and active filter. The main forms of passive filter include capacitive filtering, inductive filtering and composite filtering (L-type, LC filtering, RC filtering, etc.). The main form of active filter is active RC filtering, i.e., electronic filtering.

The noise of the power supply part includes differential mode noise and common-mode noise. The common filter circuit is generally only effective for the differential mode noise, and can not solve the influence caused by the common-mode noise.

Common-mode inductors, also called common-mode choking coils, are commonly used to suppress the common-mode noise, but they are bulky and costly. Especially for high power electronic devices, the common mode inductors are bulky and costly to ensure current capacity, which is not conducive to circuit design and system integration.

SUMMARY OF THE INVENTION

The object of the present invention is directed to provide a filter circuit in view of the problem that the existing filter circuit is difficult to suppress common-mode noise.

In order to achieve the above object, the technical solution adopted by the invention is as follows.

A filter circuit comprises a first PCB layer and a second PCB layer;
wherein the first PCB layer comprises a power line, a power supply interface, a second filter capacitor and a first filter capacitor; the power line comprises a power supply network and a GND network;
the second PCB layer comprises a conductor plane;
the power interface is connected to the GND network and is further connected to the conductor plane;
the GND network, the second filter capacitor, and the conductor plane are sequentially connected;
the power supply network, the first filter capacitor, and the conductor plane are sequentially connected.

The circuit design of the circuit structure and the overall layout design idea in the present invention have a good suppression effect on common-mode noise, differential mode noise, radiation noise and conduction noise.

Preferably, an intermediate layer is further provided between the first PCB layer and the second PCB layer, and a plurality of via holes are provided on the intermediate layer.

Preferably, the second filter capacitor is connected to the conductor plane through the via hole of the intermediate layer; the first filter capacitor is connected to the conductor plane through the via hole of the intermediate layer; the power interface is connected to the conductor plane through the via hole of the intermediate layer.

Preferably, the filter circuit further comprises a third filter capacitor connected at one end to the power supply network and at the other end to the GND network.

Preferably, the filter circuit further comprises a first filter module and a second filter module, wherein the first filter module is provided on the power supply network and the second filter module is provided on the GND network.

Preferably, the first filter module and the second filter module are inductors, magnetic beads or common-mode choking coils.

In summary, due to the adoption of the technical solution, the invention has the following beneficial effects.

A filter circuit is provided. A first PCB layer consists of a power line, a power interface, a second filter capacitor, and a first filter capacitor; the power line comprises a power supply network and a GND network; the second PCB layer is provided with a conductor plane; the power interface is connected to the GND network and is further connected to the conductor plane; the GND network, the second filter capacitor, and the conductor plane are sequentially connected; the power supply network, the first filter capacitor, and the conductor plane are sequentially connected. The circuit design of the circuit structure and the overall layout design idea in the present invention have a good suppression effect on common-mode noise, differential mode noise, radiation noise and conduction noise.

Figure 1:
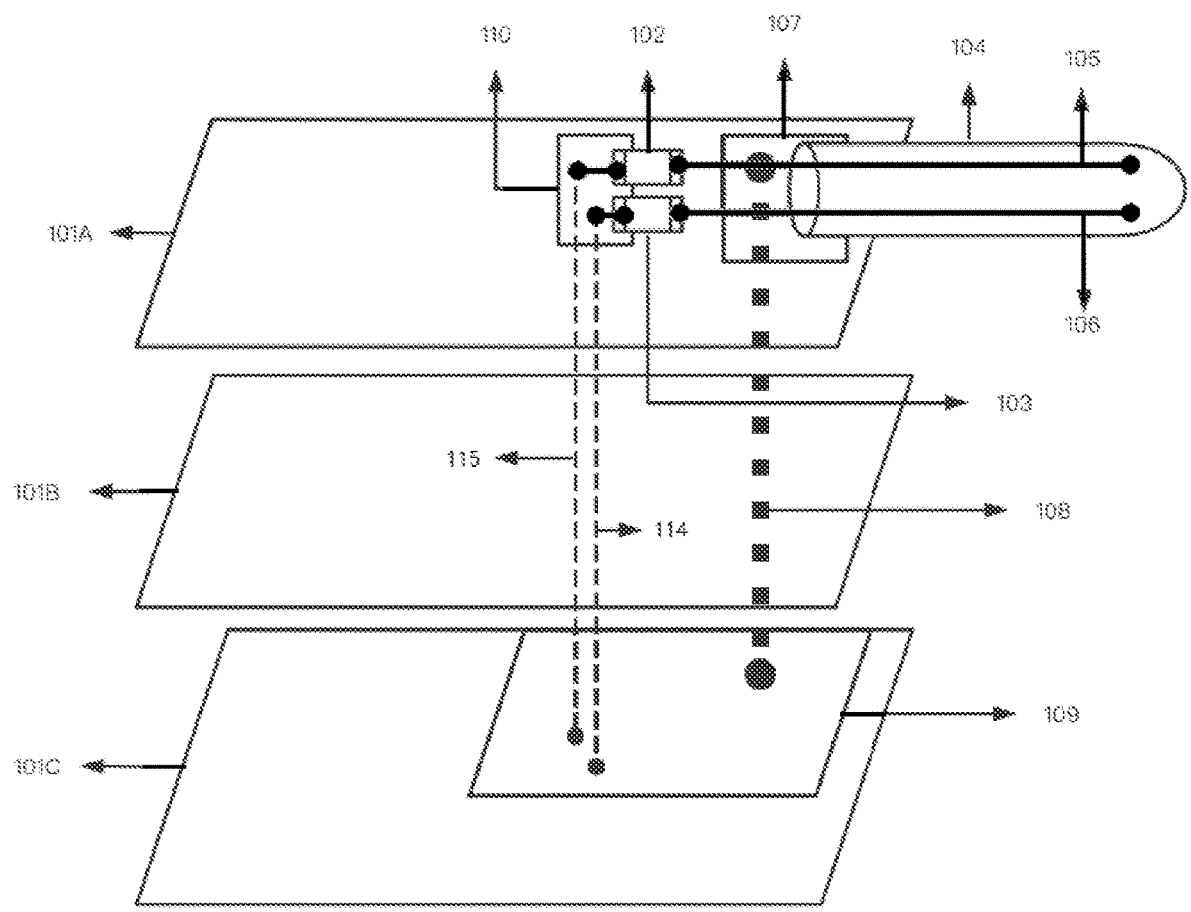
FIG. 1 is a layout structure view according to the invention.

Reference numerals: 101A—first PCB layer, 101B—intermediate layer, 101C—second PCB layer, 102—second filter capacitor, 103—first filter capacitor, 104—power line, 105—GND network, 106—power supply network, 107—power interface, 108—first metal via hole, 109—conductor plane, 110—avoidance region, 111—third filter capacitor, 112—first filter module, 113—second filter module, 114—second metal via hole, 115—third metal via hole.

DETAILED DESCRIPTION OF THE INVENTION

Hereinafter, the invention will be described in detail with reference to the accompanying drawings.

In order that the objects, aspects, and advantages of the invention will become more apparent, a more particular description of the invention will be rendered by reference to the appended drawings and embodiments. It should be understood that the specific embodiments described herein are merely illustrative of the invention and are not intended to be limiting thereof.

Embodiment 1

As shown in FIG. 1, a filter circuit includes a first PCB layer 101A and a second PCB layer 101C. The first PCB layer includes a power line 104, a power interface 107, a second filter capacitor 102 and a first filter capacitor 103. The power line 104 includes a power supply network 106 and a GND network 105. The second PCB layer 101C includes a conductor plane 109. The power interface 107 is connected to the GND network 105, and the power interface 107 is also connected to the conductor plane 109 through a first metal via hole 108. The GND network 105 is connected to one end of the second filter capacitor 102, and the other end of the second filter capacitor 102 is connected to the conductor plane 109 through a third metal via hole 115. The power supply network 106 is connected to one end of the first filter capacitor 103, and the other end of the first filter capacitor 103 is connected to the conductor plane 109 through a second metal via hole 114. An intermediate layer is further provided between the first PCB layer 101A and the second PCB layer 101C. A plurality of via holes are provided on the intermediate layer 101B, the via holes being used for passing through metal via holes. The intermediate layer can be a dielectric layer or an electrical layer plus a dielectric layer. The second filter capacitor 102 is connected to the conductor plane 109 through a via hole of the intermediate layer 101B. The first filter capacitor 103 is connected to the conductor plane 109 through the via hole of an intermediate layer 101B. The power interface 107 is connected to the conductor plane 109 through the via hole of the intermediate layer 101B.

Figure 2:
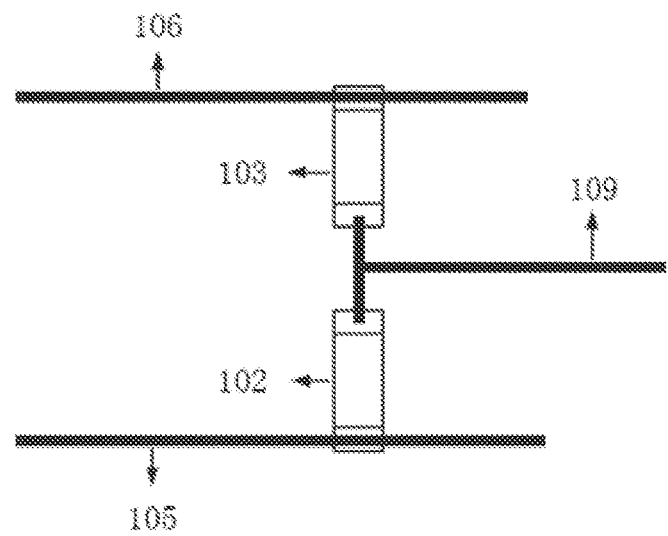
FIG. 2 is a schematic view of the circuit principle according to Embodiment 1.

Refer to the circuit principle diagram of FIG. 2, the filtering effect of the present invention has a significant effect on the noise reduction of both differential mode noise and common-mode noise.

In particular, with regard to the differential mode noise, a path 1 of the differential mode noise current on the power supply network is a GND network 105→a second filter capacitor 102→a third metal via hole 115→a conductor plane 109→a first metal via hole 108→a power interface 107→a GND network 105. A path 2 of the differential mode noise current is a power supply network 106→a first filter capacitor 103→a second metal via hole 114→a conductor plane 109→a first metal via hole 108→a power interface 107→a GND network 105. The differential mode noise enters the PCB from the power line 104, passes through a loop and returns to the power line 104, effectively blocking noise outside the PCB. The common-mode noise exists on both the power supply network and the GND network, and the path of the common-mode noise is a GND network 105→a second filter capacitor 102→a third metal via hole 115→a conductor plane 109→first metal via hole 108→a power interface 107→a GND network 105 and a power supply network 106→a first filter capacitor 103→a second metal via hole 114→a conductor plane 109→a first metal via hole 108→a power interface 107→a GND network 105. The common-mode noise enters the PCB from the power line 104, also passes through a loop and returns to the power line 104, effectively blocking noise outside the PCB. The common-mode noise and differential mode noise are the same from the path, but the principle of filtering is different.

Embodiment 2

Figure 3:
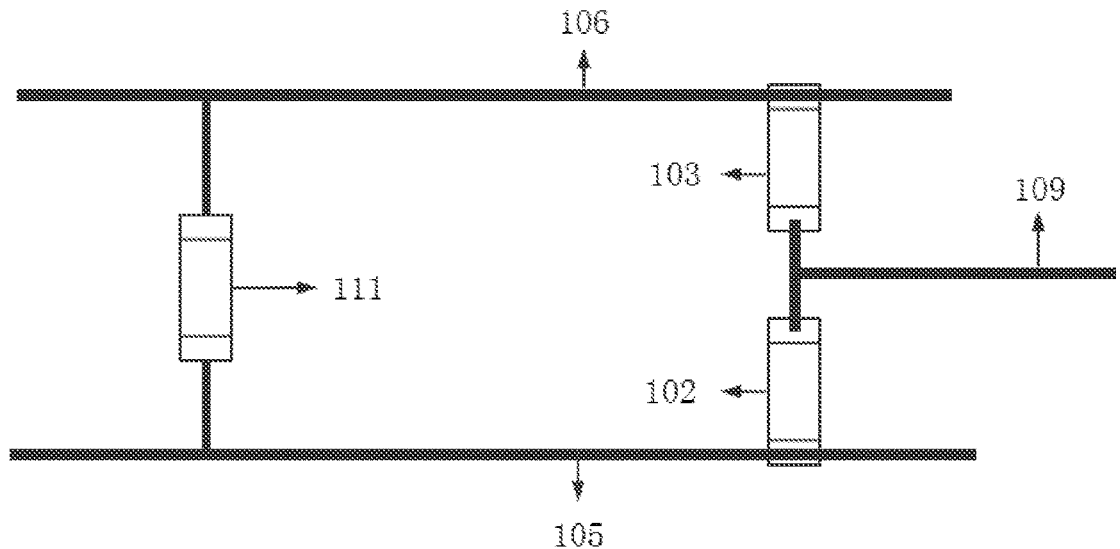
FIG. 3 is a schematic view of the circuit principle according to Embodiment 2.

The Embodiment 2 differs from Embodiment 1 in further including a third filter capacitor 111 connected at one end to the power supply network 106 and at the other end to the GND network 105, as shown in FIG. 3.

The third filter capacitor 111 is added to further optimize the filtering effect of the differential mode noise, because the third filter capacitor 111 provides a noise current path for the differential mode noise. The specific path is a GND network 105→a third filter capacitor 111→a power supply network 106 or a power supply network 106→a third filter capacitor 111→a GND network 105. The third filter capacitor 111 may be a filter capacitor or a plurality of filter capacitors, the capacitance of which may be selected according to the desired filter frequency, such as 1 nF or 100 pF.

Figure 5:
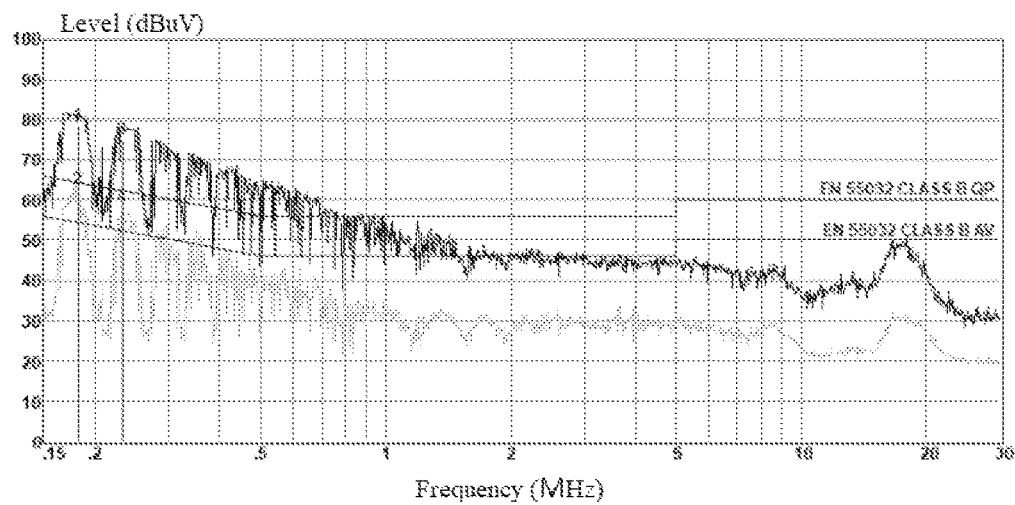
FIG. 5 shows results of conduction noise testing without the circuit of the invention.
Figure 6:
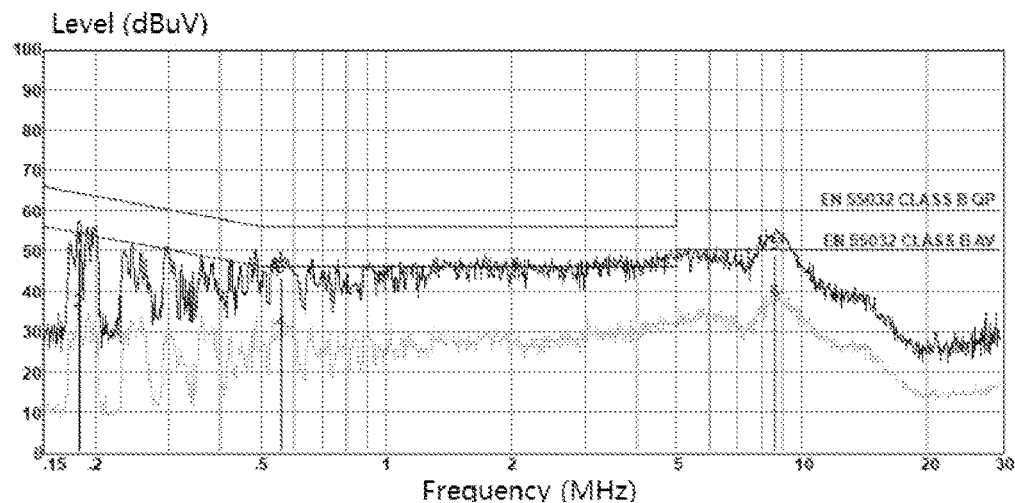
FIG. 6 shows results of conduction noise testing with the circuit of the present invention.

FIG. 5 shows the result of the conduction noise test of the filter circuit without using the circuit of the present invention and having only the third filter capacitor 111. The result shows that the conduction noise of the low frequency part below 1 MHz exceeds standard very seriously. FIG. 6 shows the result of the conduction noise test using the circuit design of this Embodiment 2, showing that no noise in the test range exceeds the standard, and the noise suppression effect is close to 30 dBuV.

Figure 7:
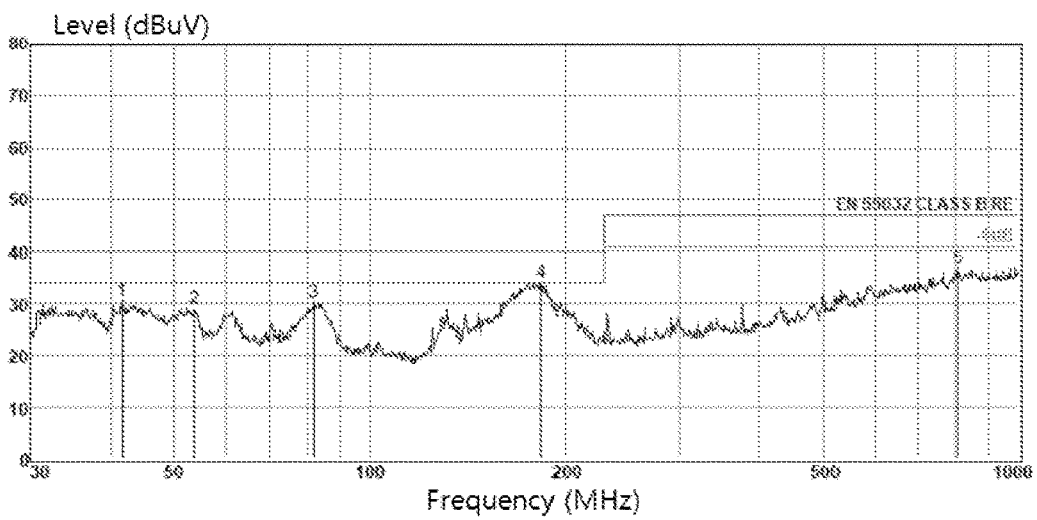
FIG. 7 shows results of radiation noise testing with the circuit of the present invention.
Figure 8:
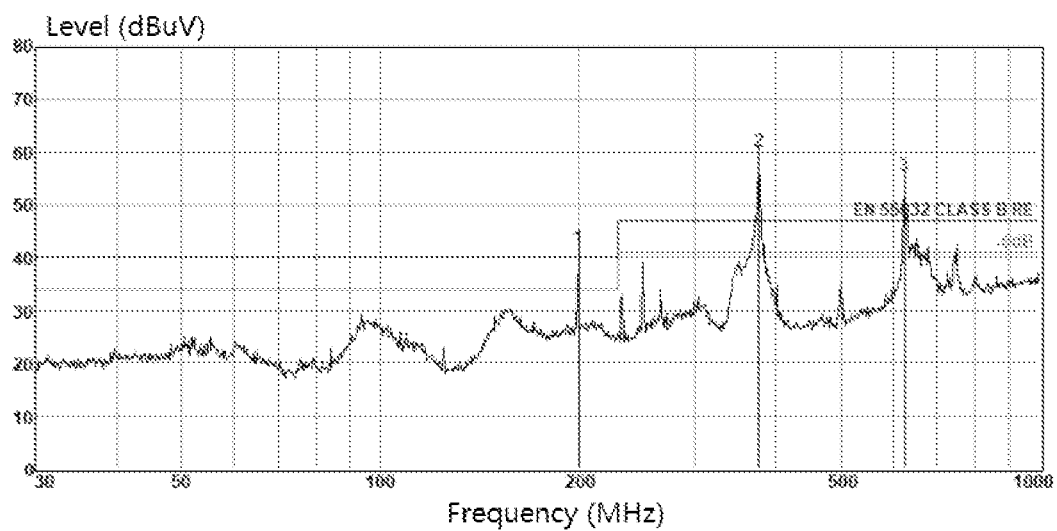
FIG. 8 shows results of radiation noise testing without the circuit of the present invention.

FIG. 8 shows the result of the radiation noise test results for a filter circuit without the circuit of the present invention and with only the S6 configuration, showing exceeded standard very seriously at 199 MHz, 375 MHz and 625 MHz. FIG. 7 shows the result of the radiation noise test result using the circuit design of this Embodiment 2, showing that there is no radiation noise exceeding the standard at all frequencies within the test range. The noise suppression effect is close to 30 dBuV/m.

Embodiment 3

Figure 4:
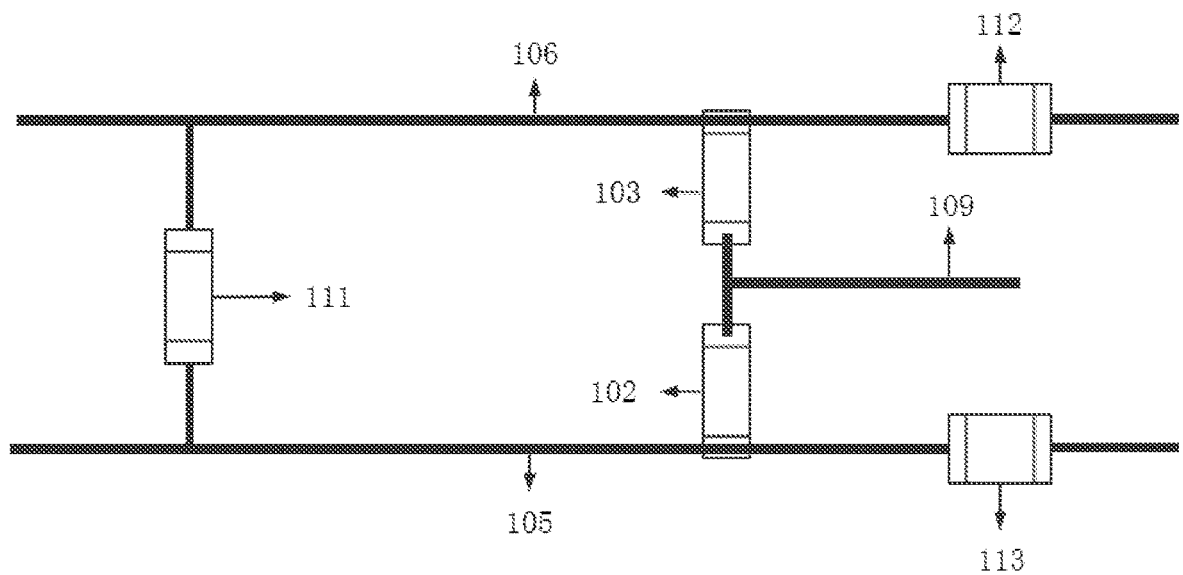
FIG. 4 is a schematic view of the circuit principle according to Embodiment 3.

This Embodiment 3 differs from Embodiment 2 in further including a first filter module 112 and a second filter module 113. The first filter module 112 is provided on the power supply network 106 and the second filter module 113 is provided on the GND network 105. The first filter module 112 and second filter module 113 are inductors or magnetic beads or common-mode choking coils, as shown in FIG. 4.

The first filter module 112 and the second filter module 113 are added to further optimize the filtering effect of common-mode noise. The first filter module 112 and the second filter module 113 can be inductors, magnetic beads or common mode choking coils. The number of the first filter module 112 and the second filter module 113 can be multiple, and are selected according to the current size of an actual circuit and the frequency of the desired filtering.

The above mentioned are only preferred embodiments of the invention and is not intended to limit the invention. Any modification, equivalent substitution and improvement made within the spirit and principles of the invention shall be covered by the protection of the invention.

What is claimed:

1. A filter circuit, comprising a first PCB layer and a second PCB layer;

wherein the first PCB layer comprises a power line, a power interface, a second filter capacitor and a first filter capacitor; the power line comprises a power supply network and a GND network;

the second PCB layer comprises a conductor plane;

the filter circuit further comprises a third filter capacitor, connected at one end to the power supply network and at another end to the GND network;

the power interface is connected to the GND network through a first metal via hole and is further connected to the conductor plane;

the GND network, the second filter capacitor, and the conductor plane are connected in series;

the power supply network, the first filter capacitor, and the conductor plane are connected in series;

the first filter capacitor is connected at one end to the power supply network and at another end to the conductor plane through a second metal via hole;

the second filter capacitor is connected at one end to the GND network and at another end to the conductor plane through a third metal via hole;

a first noise current flows along a first noise current path from the GND network to the second filter capacitor, from the second filter capacitor to the third metal via hole, from the third metal via hole to the conductor plane, from the conductor plane to the first metal via hole, from the first metal via hole to the power interface, and from the power interface to the GND network;

a second noise current flows along a second noise current path from the power supply network to the first filter capacitor, from the first filter capacitor to the second metal via hole, from the second metal via hole to the conductor plane, from the conductor plane to the first metal via hole, from the first metal via hole to the power interface, and from the power interface to the GND network; and a third noise current flows along a third noise current path (i) from the GND network to the third filter capacitor, and from the third filter capacitor to the power supply network, or (ii) from the power supply network to the third filter capacitor, and from the third filter capacitor to the GND network.

2. The filter circuit according to claim 1, further comprising an intermediate layer between the first PCB layer and the second PCB layer, the intermediate layer comprising a dielectric layer and a plurality of via holes.

3. The filter circuit according to claim 2, wherein the second filter capacitor is connected to the conductor plane through a first one of the plurality of via holes; the first filter capacitor is connected to the conductor plane through a second one of the plurality of via holes; and the power interface is connected to the conductor plane through a third one of the plurality of via holes.

4. The filter circuit according to claim 1, further comprising a first filter module and a second filter module, wherein the first filter module is on the power supply network and the second filter module is on the GND network.

5. The filter circuit according to claim 4, wherein each of the first filter module and the second filter module comprises inductors, magnetic beads or common-mode choking coils.

6. The filter circuit according to claim 2, wherein the intermediate layer further comprises an electrical layer.

7. The filter circuit according to claim 5, wherein each of the first filter module and the second filter module comprises the inductors.

8. The filter circuit according to claim 5, wherein each of the first filter module and the second filter module comprises the magnetic beads.

9. The filter circuit according to claim 5, wherein each of the first filter module and the second filter module comprises the common-mode choking coils.

10. The filter circuit according to claim 1, wherein the third noise current flows from the GND network to the third filter capacitor, and from the third filter capacitor to the power supply network.

11. The filter circuit according to claim 1, wherein the third noise current flows from the power supply network to the third filter capacitor, and from the third filter capacitor to the GND network.

* * * * *